US009350165B2

(12) United States Patent
Mozak et al.

(10) Patent No.: US 9,350,165 B2
(45) Date of Patent: May 24, 2016

(54) HIGH-VOLTAGE POWER GATING

(71) Applicant: Intel Corporation, Santa Clara, CA (US)

(72) Inventors: Christopher P. Mozak, Beaverton, OR (US); Hong Yun Tan, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 331 days.

(21) Appl. No.: 13/669,204

(22) Filed: Nov. 5, 2012

(65) Prior Publication Data

US 2014/0126090 A1 May 8, 2014

(51) Int. Cl.
*H02H 9/02* (2006.01)
*H02H 9/04* (2006.01)
*H03K 17/10* (2006.01)
*H03K 17/22* (2006.01)

(52) U.S. Cl.
CPC ............. *H02H 9/046* (2013.01); *H03K 17/102* (2013.01); *H03K 17/223* (2013.01)

(58) Field of Classification Search
USPC .......................................................... 361/56
See application file for complete search history.

(56) References Cited

U.S. PATENT DOCUMENTS

| 8,514,533 | B2 * | 8/2013 | Mozak et al. ................. 361/56 |
| 2003/0076645 | A1 * | 4/2003 | Ker ..................... H01L 27/0266 361/111 |
| 2006/0274466 | A1 * | 12/2006 | Rice .............................. 361/56 |
| 2007/0023878 | A1 * | 2/2007 | Burton ......................... 257/675 |
| 2010/0097117 | A1 * | 4/2010 | Wang .............. H03K 3/356113 327/333 |
| 2010/0188787 | A1 * | 7/2010 | Karp et al. ..................... 361/56 |
| 2011/0084552 | A1 * | 4/2011 | Færevaag ...................... 307/31 |
| 2011/0317316 | A1 * | 12/2011 | Mozak et al. .................. 361/56 |
| 2012/0104580 | A1 * | 5/2012 | Feng et al. .................... 257/673 |
| 2014/0089705 | A1 * | 3/2014 | Man et al. ..................... 713/323 |
| 2014/0126090 | A1 * | 5/2014 | Mozak et al. .................. 361/56 |
| 2014/0173317 | A1 * | 6/2014 | Shamanna et al. ............ 713/340 |

* cited by examiner

*Primary Examiner* — Ronald W Leja
(74) *Attorney, Agent, or Firm* — Blakely, Sokoloff, Taylor & Zafman LLP (57) ABSTRACT

Power gating circuits. A transistor stack is coupled between a voltage supply to provide a gated supply voltage. The supply voltage is greater than the maximum junction voltage of the individual transistors in the transistor stack. Termination circuitry for input/output (I/O) lines coupled to operate using the gated supply voltage. The termination circuitry comprising at least a resistive element coupled between an I/O interface and a termination voltage supply.

18 Claims, 5 Drawing Sheets

HIGH-VOLTAGE POWER GATING

TECHNICAL FIELD

Embodiments of the invention relate to techniques for power gating. More particularly, embodiments of the invention relate to techniques for power gating in when supply voltages are higher than supported by individual transistors.

BACKGROUND

Key aspects of modern semiconductor device design to be used in mobile applications is minimal power usage in an idle state and how quickly the device can transition in and out of the idle (and other low power) states. Ideally, the device would transition in and out of low power states with no latency and consume no power while in the low power state. One technique to achieve no power consumption is to completely turn off the supply voltage to the device. However, this is often problematic because turning on an external voltage regulator results in some latency, often many milliseconds when desired targets are much shorter. Further, in the case of memory devices, the external power must be maintained in order to maintain the memory contents. Thus, current techniques are not optimal.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

To solve the problems describe above in other areas, power gates have been used to provide a large reduction in idle power with relatively low exit latency. However, there have been several barriers to use of traditional power gating in input/output (I/O) applications (e.g., memory). These barriers include, for example, claims required for electrostatic discharge (ESD) protection in I/O interfaces use resistor-capacitor (RC) timers to detect ESD events and react to them. These RC timers cannot distinguish between an ESD event and a power gate quickly ramping up a supply voltage. Thus, ESD claims have interfered with power gating approaches.

Also, I/O performance requires a low impedance signal return path to achieve high-speed I/O operation. Further, there is complexity involved in designing a power gate that can shut off a high voltage supply (e.g., 1.5 V for DDR3) using transistors that can only support a maximum voltage across any junction (e.g., drain-gate, gate-source, drain-source) of, for example, 1.0 V. Use of 1.0 V logic is common for memory I/O to avoid the high cost of adding high voltage tolerate transistors to the process (i.e., use of thick gate transistors). Over time, both the logic technology and dram technology $V_{max}$ will reduce. However, it is safe to assume that logic $V_{max}$ will remain significantly below DRAM $V_{typical}$.

The architecture described herein results in an on-die power gating architecture that can solve the problems set forth above. In one embodiment, an ESD clamp can be used that relaxes the power supply ramp rate (e.g., to 10 mV/ms) that allow for improved voltage ramp from low power states.

In one embodiment, the power gates may be integrated directly (or nearly directly) under the power bumps, close to the transmitter/receiver circuits. This eliminates large inductive loops for signal return currents. Power or ground gating could be used. Without loss of generality, the examples in this patent will simply assume a power gate using PMOS transistors. However, to those skilled in the art, this scheme can easily be adopted to a ground gate using NMOS transistors. In one embodiment, the power bumps are C4 bumps. Alternate implementations may use other technologies to connect power/ground from the package to the silicon die.

With careful metal planning and power gate design, a series resistance of <1 Ω/IO or <10 mΩ/DDR channel can be achieved. Between the small resistance increase and no significant inductive increase, this can enable the power gate to be use in high-speed, single-ended I/O interfaces with large signal return currents. Further, by referencing all signals to $V_{ss}$ on at least one side in the package or motherboard routing, the $V_{ss}$ signal return power plane can be continuous and this can further minimize any signal integrity degradation due to the additional impedance associated with $V_{dd}$.

In one embodiment, a stacked power gate can be used to handle the high voltage support with low voltage transistors. When off, the power gate appears as two series off transistors to maximize off resistance. In one embodiment, the bottom transistor N well may be locally connected to reduce junction leakage.

When on, the power gate looks like two series transistors in linear region with $V_{gs}=V_{dd}*\frac{2}{3}\sim V_{max}$ allowed by the process. Although two series transistors are shown here, this scheme can be extends to stack additional transistors to either allow high supply voltages or lower off state leakage currents. When the power gate is off, the gated supply, the gated output supply floats and is not pulled to ground except though the leakage of the downstream logic. Also, the circuit does not explicitly require the gated voltage to drop to any specific voltage to function.

Figure 1:
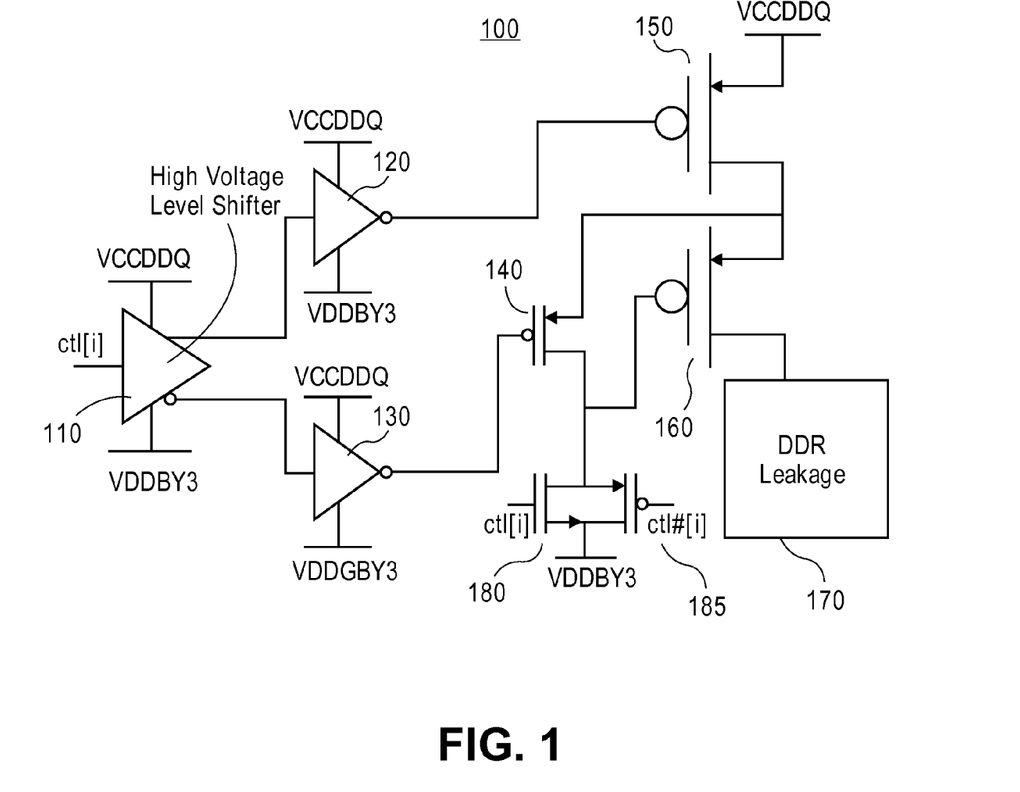
FIG. 1 is a circuit diagram of one embodiment of an on-die power gating architecture for input/output (I/O) applications.

FIG. 1 is a circuit diagram of one embodiment of an on-die power gating architecture for input/output (I/O) applications. For simplicity, some of the devices in FIG. 1 can be cascaded using $V_{dd}/3$ (PMOS) or $2V_{dd}/3$ (NMOS) to protect against high voltages but are not illustrated in FIG. 1.

In one embodiment, on-die power gating architecture 100 has provided to it positive supply voltage (e.g., $V_{cc}$, $V_{dd}$), negative supply voltage (e.g., $V_{ee}$, $V_{ss}$) as well as fractional supply voltages (e.g., $V_{dd}/3$). The control signal (ctl[i]) is provided to high voltage level shifter 110, which provides input signals to buffers 120 and 130. The output signal from buffer 120 is coupled to the gate of transistor 150, which has a source coupled to the supply voltage and a drain coupled to the source of transistor 140 and to the source of transistor 160.

The output signal from buffer 130 is coupled to the gate of transistor 130, which has its drain coupled to the gate of transistor 160 and to transistors 180 and 185 that couple it with a fractional supply voltage in response to the control signal. The drain of transistor 160 is coupled to allow memory leakage current 170 to flow, which is describe in greater detail below.

The power gating architecture of FIG. 1 operates to provide the advantages described above and to allow for power gating on I/O lines with an on-die solution. The current leakage path is described with respect to FIG. 3 below.

Another issue that may affect the I/O power gate performance is the termination scheme. In DDR, for example, data signals can use on-die termination that will be off during low power states. However, command/control signals are often terminated to $V_{tt}$ ($V_{dd}/2$) using a physical resistor (See FIG. 2). This termination may limit the ability of the gated power from going below $V_{dd}/2$ and limit the potential power savings. This is solved in two ways, which are discussed below with respect to FIG. 3.

Figure 2:
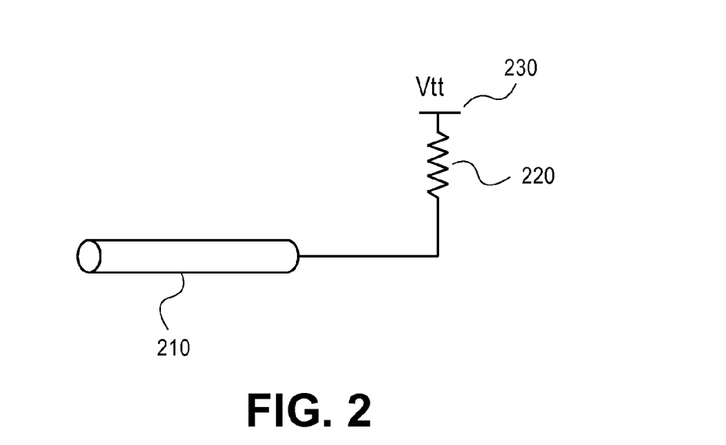
FIG. 2 is a circuit diagram of one embodiment of a termination scheme that may utilize the power gating architecture of FIG. 1.

FIG. 2 is a circuit diagram of one embodiment of a termination scheme that may utilize the power gating architecture of FIG. 1. The example of FIG. 2 illustrates only a single transmission line; however, any number of transmission lines can be utilized and coupled with the voltage supply.

In one embodiment, all of the elements of the voltage supply circuitry and the termination circuitry reside on the die to which transmission line 210 is coupled. In one embodiment, transmission line 210 is used for I/O signaling; however, other types of signals may also be transmitted over transmission line 210.

Voltage rail 230 provides a supply voltage for termination of transmission line 210. Resistor 220 is coupled between the end of transmission line 210 and voltage rail 230 to provide termination for transmission line 210. The resistance value of resistor 220 can be selected in any manner known in the art in order to provide the desired termination characteristics.

In one embodiment, during shallow power states, the P-bias can be increased from its normal value (e.g., $V_{dd}/3$) to a higher value (e.g., $\frac{2}{3}*V_{dd}$) to turn off the pull up transistor path. The PMOS N-well junction is allowed to go forward biased, which is generally safe because I/O lines are designed to have robust circuits for ESD protection that will prevent damage in these conditions. The forward bias junction may limit the gated voltage from going below a small positive voltage (e.g., ~0.2 V). This forward bias leakage path is shown by the arrow in FIG. 3.

Figure 3:
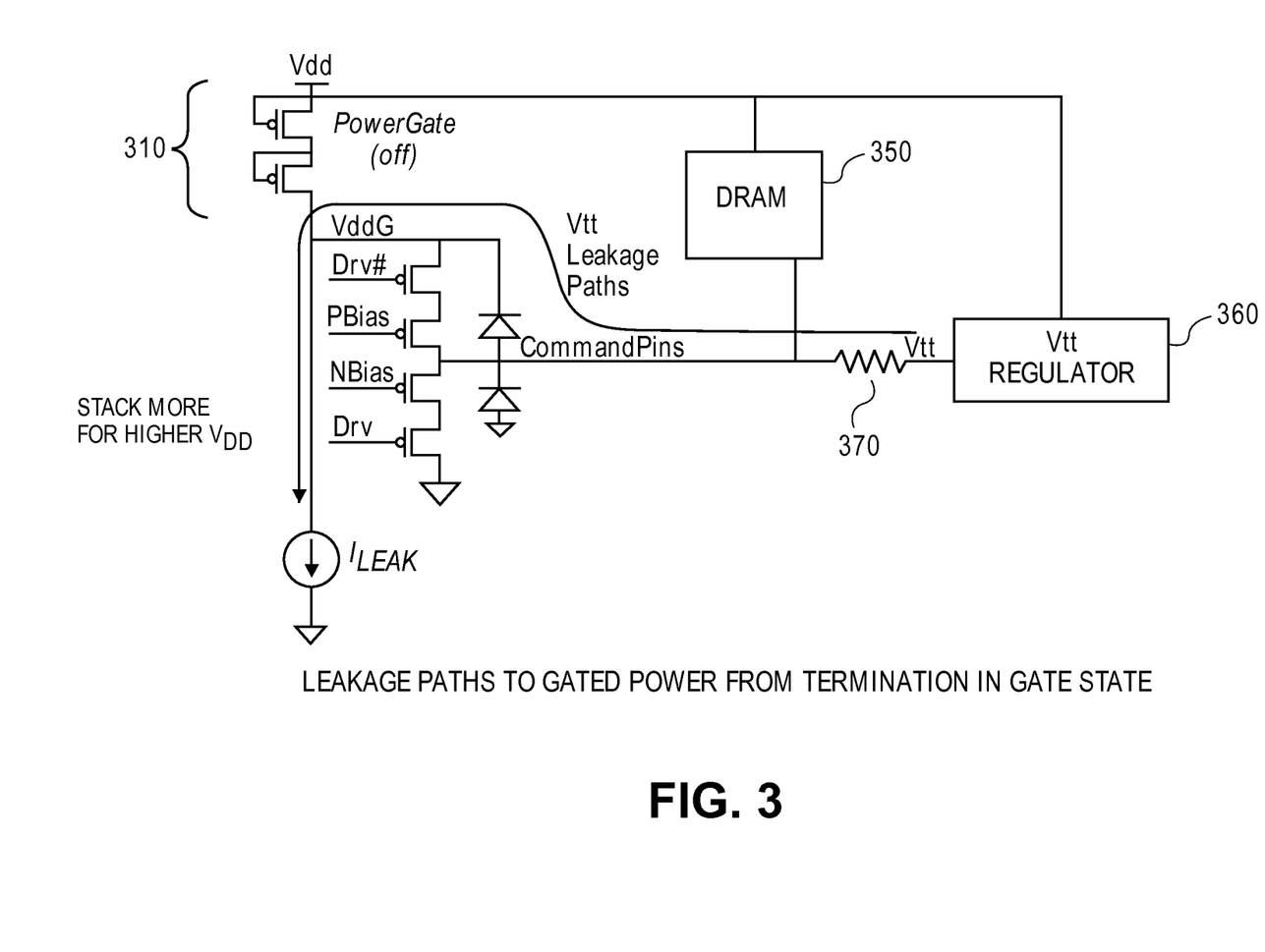
FIG. 3 is a circuit diagram of one embodiment of a stacked transistor power gating architecture.

FIG. 3 is a circuit diagram of one embodiment of a stacked transistor power gating architecture. Stacked transistors 310 operate as a power gate to provide the supply voltage ($V_{dd}$) to termination and other I/O circuitry. In one embodiment, the supply voltage is also provided memory (e.g., DRAM 350) and to a voltage regulator ($V_{tt}$ regulator 360) that provides a supply voltage for termination (resistor 370) purposes (as illustrated in FIG. 2). In one embodiment, Nbias/Pbias are used to limit the voltage across different junctions for the high voltage output driver.

In one embodiment, two transistors are used for a stacked power gate; however, for higher voltages more than two transistors may be used to provide a stacked power gate. When the power gate is off (the supply voltage is not provided), a leakage path exists from $V_{tt}$ regulator 360 to ground through the command line termination.

In one embodiment, during deep power states the $V_{tt}$ power rail can be completely shut off to achieve increased power savings. In one embodiment, in order to minimize exit latency, state and other information that is stored by circuits powered by the $V_{dd}$ rail are locally maintained using ungated $V_{dd}$ power (or other unrelated rails that remain alive) such that no save/restore is required and the chip can power up very quickly. In some embodiments, the latency of the power gate turning on can be small enough that it is completely hidden in the PLL lock time (or other on-die circuits).

Figure 4A:
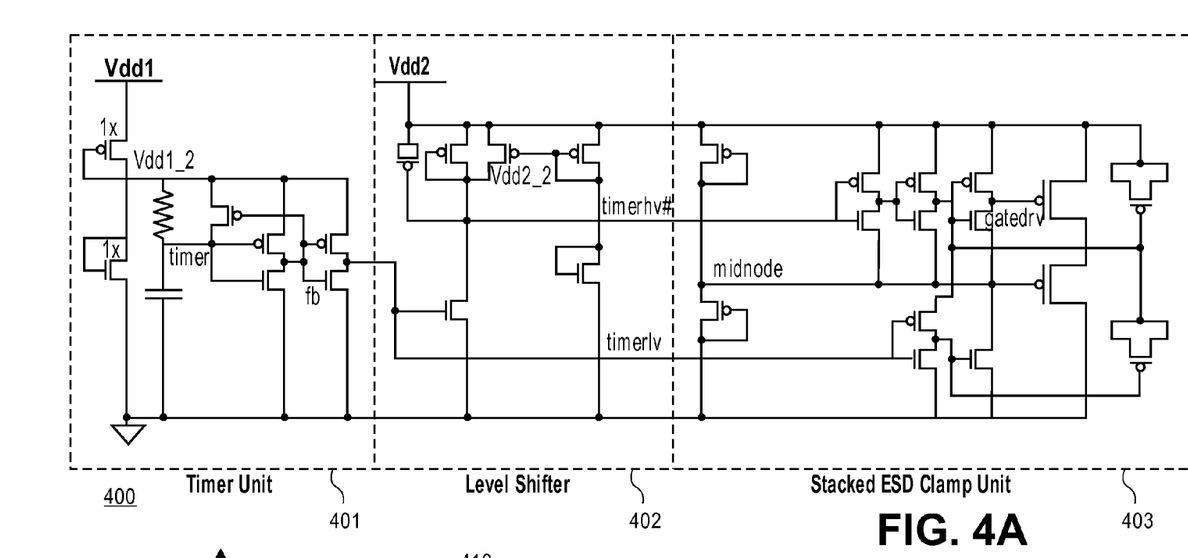
FIG. 4A illustrates one embodiment of an ESD protection circuit with a level shifter.

FIG. 4A illustrates one embodiment of an ESD protection circuit 400 with a level shifter 402. In this embodiment, the ESD protection circuit 400 comprises a timer unit 401, the level shifter 402, and the clamp unit 403. In one embodiment, the timer unit 401 comprises an RC network coupled to a feedback unit operable to generate the feedback signal fb. In this embodiment, the first supply signal $V_{dd1}$ is higher than an allowable gate oxide voltage limit for the transistor process manufacturing technology. In one embodiment, the timer unit 401 operates on a divided first supply signal to avoid oxide breakdown for transistors.

In one embodiment, the output signal timerlv of the timer unit 401 is input to the level shifter 402. In one embodiment, the level shifter 402 is operable to generate a timerhv# signal from the timerlv signal. In one embodiment, the level shifter 402 is operable to keep the timerhv# signal at logical low level while the second supply signal $V_{dd2}$ is ramping up. In one embodiment, the level shifter 402 is operable to keep the timerhv# signal at a logical low level by using the first supply signal $V_{dd1}$ to power the pulldown device in the level shifter 402 via the timerlv signal. In such an embodiment, the timerhv# signal is a concave waveform shape that keeps the clamp devices off while the second supply signal ramps up.

Figure 4B:
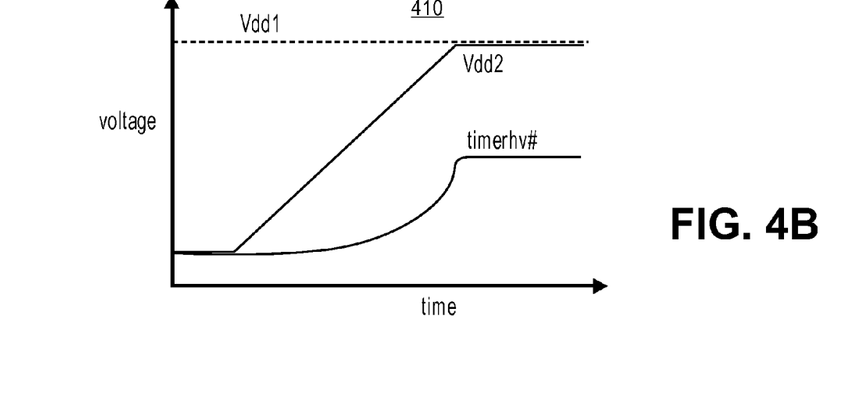
FIG. 4B illustrates a voltage-time graph of a concave waveform shape of the timerhv# signal relative to the ramp of the second supply signal $V_{dd2}$, according to the embodiment of FIG. 4A.

FIG. 4B illustrates a voltage-time graph 410 of a concave waveform shape of the timerhv# signal relative to the ramp of the second supply signal $V_{dd2}$, according to the embodiment of FIG. 4A.

In one embodiment, the output signals of the level shifter 401 (timerlv and timerhv#) are received by the clamp unit 403. In one embodiment, the devices in the clamp unit 403 are stacked to reduce the effects of oxide breakdown of the devices in the clamp unit 403. In one embodiment, the signal midnode is a bias signal set to a logical mid level of the second supply signal $V_{dd2}$ and the ground signal. In one embodiment, the midnode signal provides a raised ground level to the clamp device M1 to reduce the effects of oxide reliability. In one embodiment, another circuit topology may be used for the level shifter 402.

Figure 5:
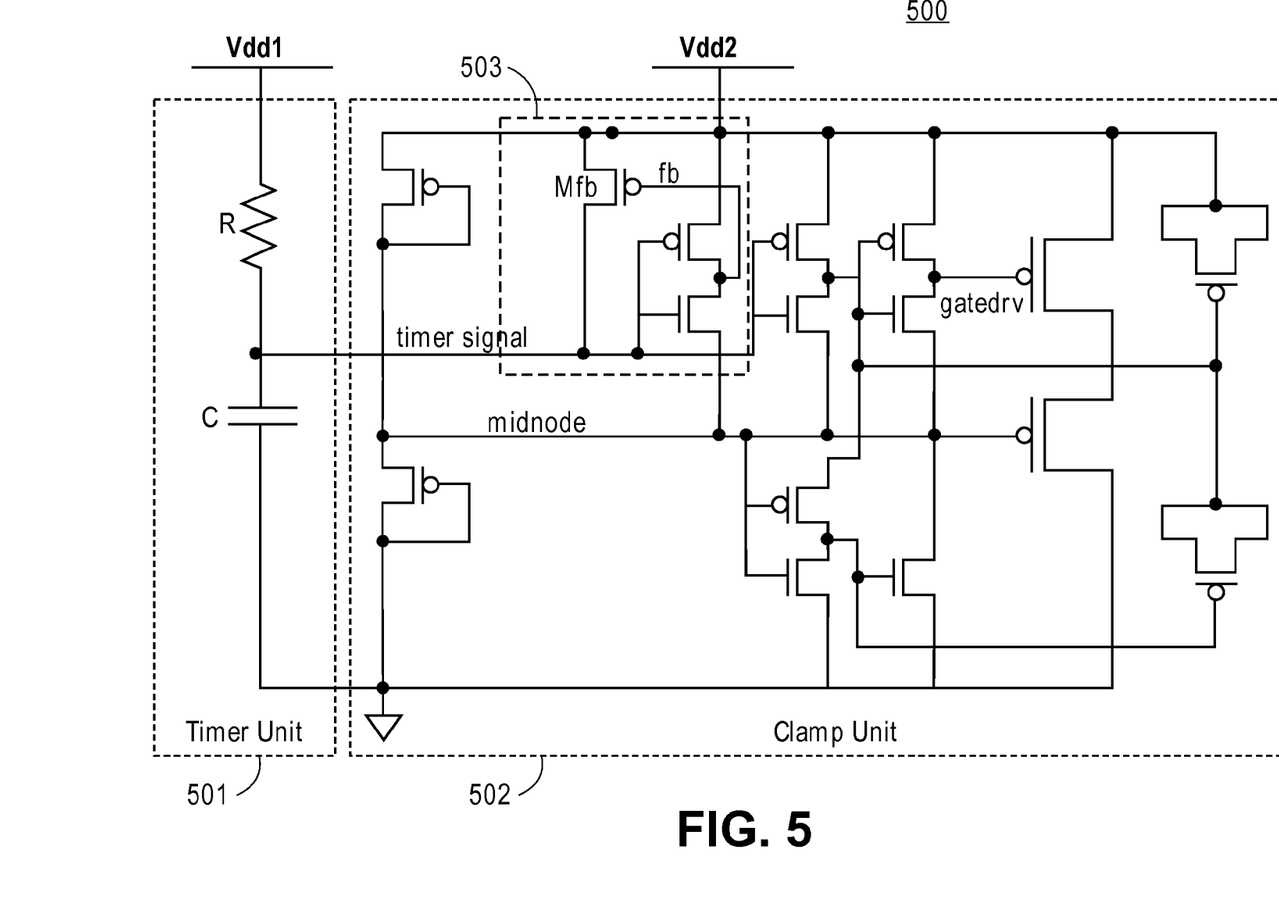
FIG. 5 illustrates another embodiment of an ESD protection circuit.

FIG. 5 illustrates another embodiment of an ESD protection circuit 500. In this embodiment, when the second supply signal $V_{dd2}$ ramps down, the feedback unit 503 generating the fb signal will cause the timer signal to ramp down with the supply signal $V_{dd2}$ until the timer signal reaches a threshold voltage level ($V_{tp}$) of the feedback transistor $M_{fb}$. In such an embodiment, the resistor of the timer unit 501 keeps the node with the timer signal from dropping any lower that the threshold voltage level ($V_{tp}$) of the feedback transistor $M_{fb}$. In such an embodiment, when the second supply signal $V_{dd2}$ ramps back up, the inverter and the feedback PMOS device $M_{fb}$ of the feedback unit 503 behave as an amplifier to keep the timer node high.

Figure 6:
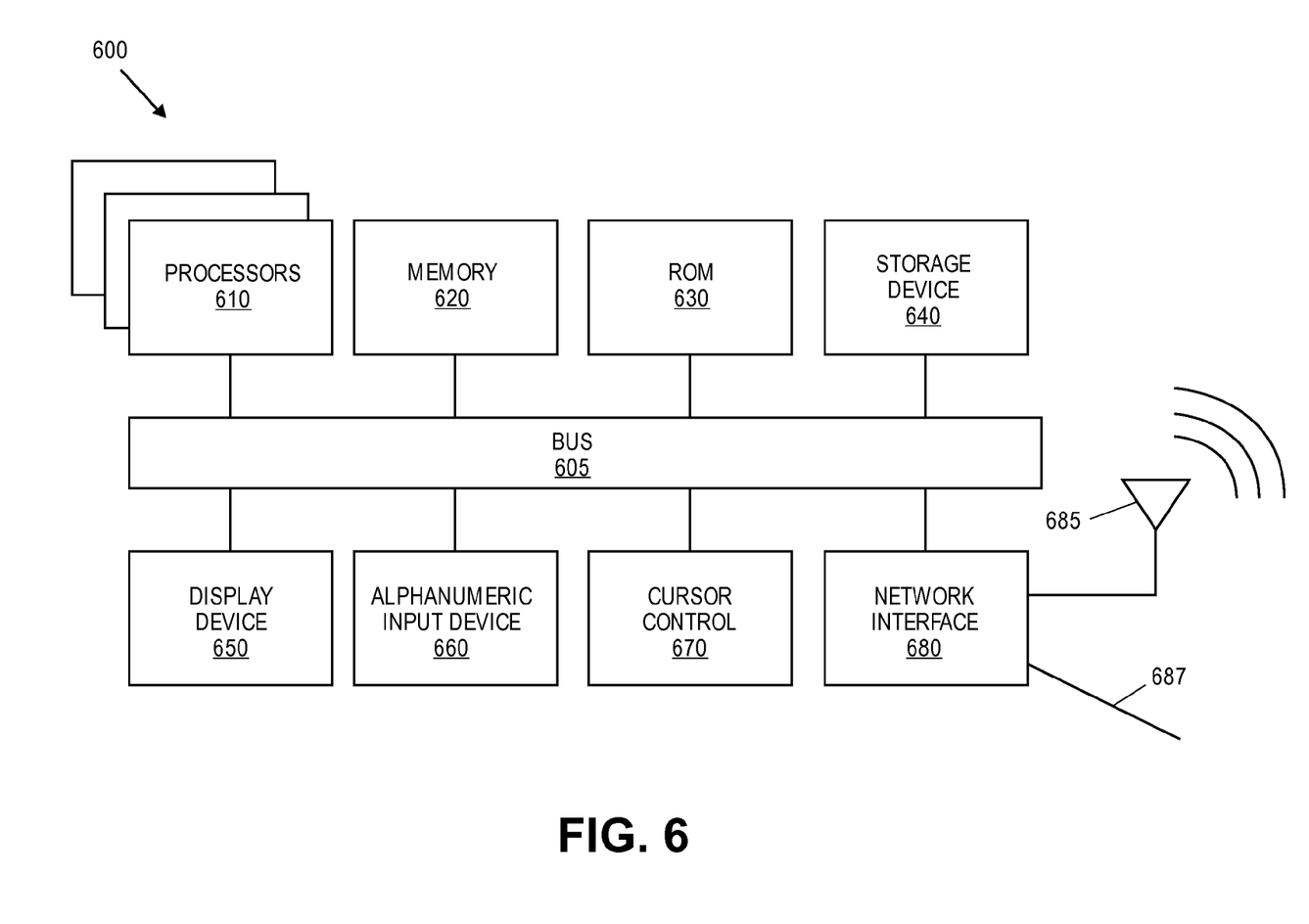
FIG. 6 is a block diagram of one embodiment of an electronic system.

FIG. 6 is a block diagram of one embodiment of an electronic system. The electronic system illustrated in FIG. 6 is intended to represent a range of electronic systems (either wired or wireless) including, for example, desktop computer systems, laptop computer systems, cellular telephones, personal digital assistants (PDAs) including cellular-enabled PDAs, set top boxes, tablets, etc. Alternative electronic systems may include more, fewer and/or different components. The components of electronic system 600 may include the ESD, termination and/or power gating techniques described herein.

Electronic system 600 includes bus 605 or other communication device to communicate information, and processor 610 coupled to bus 605 that may process information. While electronic system 600 is illustrated with a single processor, electronic system 600 may include multiple processors and/or co-processors. Electronic system 600 further may include random access memory (RAM) or other dynamic storage device 620 (referred to as main memory), coupled to bus 605 and may store information and instructions that may be executed by processor 610. Main memory 620 may also be used to store temporary variables or other intermediate information during execution of instructions by processor 610.

Electronic system 600 may also include read only memory (ROM) and/or other static storage device 630 coupled to bus 605 that may store static information and instructions for processor 610. Data storage device 640 may be coupled to bus 605 to store information and instructions. Data storage device 640 such as a magnetic disk or optical disc and corresponding drive may be coupled to electronic system 600.

Electronic system 600 may also be coupled via bus 605 to display device 650, such as a cathode ray tube (CRT) or liquid crystal display (LCD), to display information to a user. Alphanumeric input device 660, including alphanumeric and other keys, may be coupled to bus 605 to communicate information and command selections to processor 610. Another type of user input device is cursor control 670, such as a mouse, a trackball, or cursor direction keys to communicate direction information and command selections to processor 610 and to control cursor movement on display 650.

Electronic system 600 further may include network interface(s) 680 to provide access to a network, such as a local area network. Network interface(s) 680 may include, for example, a wireless network interface having antenna 685, which may represent one or more antenna(e). Network interface(s) 680 may also include, for example, a wired network interface to communicate with remote devices via network cable 687, which may be, for example, an Ethernet cable, a coaxial cable, a fiber optic cable, a serial cable, or a parallel cable.

In one embodiment, network interface(s) 680 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 680 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In one embodiment, a power gating circuit includes a transistor stack coupled between a voltage supply to provide a gated supply voltage wherein the supply voltage is greater than the maximum junction voltage of the individual transistors in the transistor stack. Termination circuitry for input/output (I/O) lines is coupled to operate using the gated supply voltage. The termination circuitry comprising at least a resistive element coupled between an I/O interface and a termination voltage supply In one embodiment, the power gating curing also includes a timer unit having a node with a first supply signal and to generate a first timer signal based on the first supply signal and a clamp unit configured to not trigger while the power gate is ramping, coupled to the timer unit and having a node with a second supply signal, operable to clamp the second supply signal in response to electrostatic discharge (ESD).

In one embodiment, the timer unit generates the first timer signal with a time constant longer than the duration of an ESD event on the node with the second supply signal. In one embodiment, the termination circuitry is coupled to terminate transmission lines coupled with a memory device.

In one embodiment, the memory device comprises a dynamic random access memory (DRAM) device. In one embodiment, the gated output supply floats and is not pulled to ground except through leakage through the termination circuitry. IN one embodiment, during at least a shallow power state, a bias voltage is increased to turn off a pull up transistor path.

In one embodiment, a system having a power gating circuit includes a transistor stack coupled between a voltage supply to provide a gated supply voltage. The supply voltage is greater than the maximum junction voltage of the individual transistors in the transistor stack. Termination circuitry for input/output (I/O) lines is coupled to operate using the gated supply voltage. The termination circuitry comprising at least a resistive element coupled between an I/O interface and a termination voltage supply. A resistive element is coupled between a first end of a transmission line and the supply voltage, and a dynamic random access memory (DRAM) array coupled with a second end of the transmission line.

In one embodiment, the system also includes a timer unit having a node with an ungated supply signal and operable to generate a first timer signal based on the first supply signal. A clamp unit, coupled to the timer unit and has a node with a gated supply signal to clamp the gated supply signal in response to electrostatic discharge (ESD), and to clamp for a duration based on a signal level of the first timer signal.

In one embodiment, the timer unit is operable to generate the first timer signal with a time constant longer than the duration of an ESD event on the node with the second supply signal. In one embodiment, the termination circuitry is coupled to terminate transmission lines coupled with a memory device.

In one embodiment, the memory device comprises a dynamic random access memory (DRAM) device. In one embodiment, the gated output supply floats and is not pulled to ground except through leakage through the termination circuitry. In one embodiment, during at least a shallow power state, a bias voltage is increased to turn off a pull up transistor path.

In one embodiment, the power gate is positioned directly under a package power supply connection. In one embodiment, I/O signals are at least partially referenced to Vss to avoid the power gate from impacting signal return paths. In one embodiment, critical I/O related state is stored on power supplies that remain alive to minimize wake up time.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus, comprising:
a semiconductor chip comprising:
a timer circuit, the timer circuit having an output, the timer circuit to receive a first supply voltage from a first power rail, the timer circuit to generate a signal at the timer circuit output that is responsive to an ESD spike but not a slower supply voltage ramp when transitioning from a low supply voltage power state to a higher supply voltage power state;
an ESD clamping circuit to protect an I/O circuit, the ESD clamping circuit to receive a second supply voltage from a second power rail, the second supply voltage larger than the first supply voltage;
a level shifter between the ESD clamping circuit and the timer circuit, the level shifter coupled to the second power rail, the level shifter to receive the signal and generate a higher voltage version of the signal for presentation to the ESD clamping circuit;
a gate circuit comprising first and second transistors in series with a current path that emanates from the second supply voltage rail and flows through the I/O circuit, the gate circuit to keep the first and second transistors off during the low supply voltage power state and on during the higher supply voltage power state, the first and second transistors having a voltage rating that is less than the second supply voltage, the gate circuit comprised of a circuit having a supply node coupled to the second power rail and a return node coupled to a third power rail, the third power rail to provide a third supply voltage that is fraction of the second supply voltage, the fraction being less than ½.

2. The apparatus of claim 1 wherein the first and second transistors are integrated underneath power bumps of the semiconductor chip.

3. The apparatus of claim 1 wherein the slower supply voltage ramp is 10 mv/ms or less.

4. The apparatus of claim 1 wherein the gate circuit is a power gate circuit and the first and second transistors are P type transistors.

5. The apparatus of claim 1 wherein the gate circuit is a ground gate circuit and the first and second transistors are N type transistors.

6. The apparatus of claim 1 wherein the second power rail is also to provide power to any of:
a memory device that is coupled to the I/O circuit;
a termination voltage regulator.

7. The apparatus of claim 1 wherein the second power rail is also to coupled to a termination voltage regulator.

8. A computing system, comprising:
a timer circuit, the timer circuit having an output, the timer circuit to receive a first supply voltage from a first power rail, the timer circuit to generate a signal at the timer circuit output that is responsive to an ESD spike but not a slower supply voltage ramp when transitioning from a low supply voltage power state to a higher supply voltage power state;
an ESD clamping circuit to protect an I/O circuit, the ESD clamping circuit to receive a second supply voltage from a second power rail, the second supply voltage larger than the first supply voltage;
a level shifter between the ESD clamping circuit and the timer circuit, the level shifter coupled to the second power rail, the level shifter to receive the signal and generate a higher voltage version of the signal for presentation to the ESD clamping circuit;
a gate circuit comprising first and second transistors in series with a current path that emanates from the second supply voltage rail and runs through the I/O circuit, the gate circuit to keep the first and second transistors off during the low supply voltage power state and on during the higher supply voltage power state, the first and second transistors having a voltage rating that is less than the second supply voltage, the gate circuit comprised of a circuit having a supply node coupled to the second power rail and a return node coupled to a third power rail, the third power rail to provide a third supply voltage that is fraction of the second supply voltage, the fraction being less than ½; and,
a memory device that is coupled to receive power from the second power rail and that is coupled to the I/O circuit.

9. The system of claim 8 wherein the timer circuit, the ESD clamping circuit, the I/O circuit, the level shifter and the gate circuit are all on a semiconductor die.

10. The system of claim 9 wherein the first and second transistors are integrated underneath power bumps of the semiconductor chip.

11. The system of claim 8 wherein the slower supply voltage ramp is 10 mv/ms or less.

12. The system of claim 8 wherein the gate circuit is a power gate circuit and the first and second transistors are P type transistors.

13. The apparatus of claim 8 wherein the gate circuit is a ground gate circuit and the first and second transistors are N type transistors.

14. A method, comprising:
raising an ESD detect signal in response to an ESD voltage spike;
keeping an ESD clamping circuit enabled during said ESD voltage spike;
keeping first and second gate transistors off during a low supply voltage power state, said first and second gate transistors coupled in series with an I/O circuit, said first and second gate transistors having a voltage rating that is less than a supply voltage of a supply voltage rail that supplies the I/O circuit;
transitioning from said low supply voltage power state to a higher supply voltage power state;
not raising said ESD detect signal and turning said first and second gate transistors on as part of said transitioning, wherein, said turning of said first and second transistors on is performed with a circuit that receives said supply voltage at a supply node and receives a fraction of said supply voltage at a return node, the fraction being less than ½.

15. The method of claim 14 further comprising keeping a memory device that is coupled to the I/O circuit powered on during the low supply voltage power state.

16. The method of claim 15 further comprising powering a termination voltage regulator with a same power rail that powers the memory device and the I/O circuit.

17. The method of claim 14 wherein the first and second transistors are P type transistors.

18. The method of claim 14 wherein the first and second transistors are N type transistors.

* * * * *